United States Patent
Chen et al.

(10) Patent No.: US 8,424,343 B2
(45) Date of Patent: Apr. 23, 2013

(54) LASER PROCESSING OF GLASS FRIT FOR SEALING APPLICATIONS

(75) Inventors: Dongmin Chen, Saratoga, CA (US); Matthew William Bellis, Yokohama (JP)

(73) Assignee: MIRADIA, Inc., Sunnyvale, CA (US)

( * ) Notice: Subject to any disclaimer, the term of this patent is extended or adjusted under 35 U.S.C. 154(b) by 419 days.

(21) Appl. No.: 12/390,372

(22) Filed: Feb. 20, 2009

(65) Prior Publication Data

US 2009/0205371 A1    Aug. 20, 2009

Related U.S. Application Data

(60) Provisional application No. 61/030,203, filed on Feb. 20, 2008.

(51) Int. Cl.
 *C03B 29/00*    (2006.01)
(52) U.S. Cl.
 USPC ............................................................... 65/34
(58) Field of Classification Search .................. 65/33.5, 65/33.6, 34, 59.5
 See application file for complete search history.

(56) References Cited

U.S. PATENT DOCUMENTS

| | | | | |
|---|---|---|---|---|
| 3,113,878 A | * | 12/1963 | Martin | 501/5 |
| 4,251,252 A | * | 2/1981 | Frazier | 65/34 |
| 4,380,855 A | * | 4/1983 | Deckman et al. | 29/407.04 |
| 4,769,310 A | | 9/1988 | Gugger et al. | |
| 5,855,638 A | * | 1/1999 | Demars | 65/34 |
| 5,954,850 A | * | 9/1999 | Bernot et al. | 65/60.1 |
| 6,998,776 B2 | | 2/2006 | Aitken et al. | |
| 7,585,747 B1 | | 9/2009 | Chen | |
| 2005/0001545 A1 | * | 1/2005 | Aitken et al. | 313/512 |
| 2005/0116245 A1 | * | 6/2005 | Aitken et al. | 257/99 |
| 2007/0241417 A1 | * | 10/2007 | Huibers et al. | 257/436 |
| 2007/0269921 A1 | * | 11/2007 | You | 438/50 |
| 2008/0124558 A1 | | 5/2008 | Boek et al. | |

OTHER PUBLICATIONS

LMC6001P Bronze for Glass / Ceramic Laser Settings, Leading Technology in Laser Marking, THERMARK laser marking technology, www.thermark.com, 2008.

* cited by examiner

*Primary Examiner* — Matthew Daniels
*Assistant Examiner* — Erin Snelting
(74) *Attorney, Agent, or Firm* — Patterson & Sheridan, LLP

(57) ABSTRACT

Light-absorbing glass frit material is used to seal an opening in a device or a plurality of devices in a batch process. The glass frit material is applied and then irradiated with light having a wavelength absorbed by the glass frit material so that the glass frit ball undergoes a glassy transition and forms a seal. When sealing an opening in a device, the glass frit material may be applied as a spherical ball such that the spherical ball covers the opening. The volume of the spherical ball may be selected to determine the final shape of the seal.

25 Claims, 9 Drawing Sheets

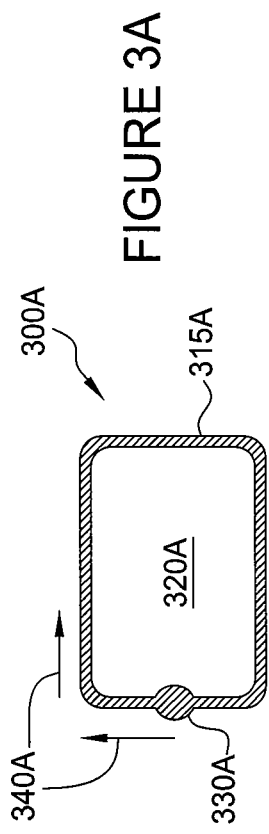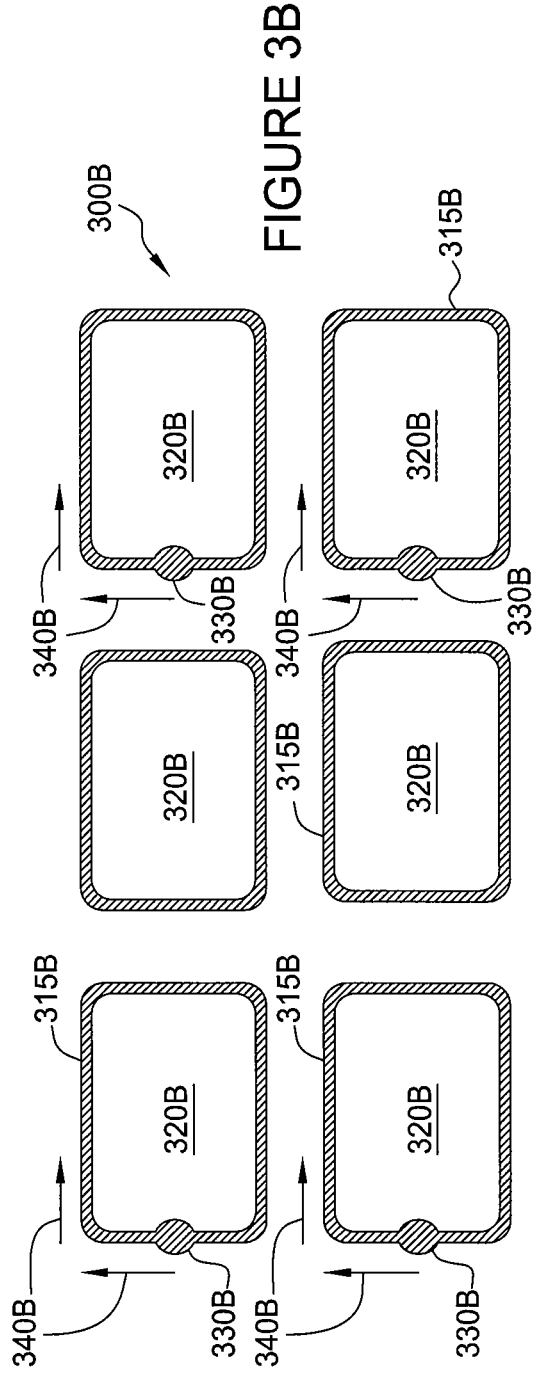

LASER PROCESSING OF GLASS FRIT FOR SEALING APPLICATIONS

CROSS-REFERENCE TO RELATED APPLICATIONS

This application claims the benefit of the U.S. Provisional Patent Application Ser. No. 61/030,203, filed Feb. 20, 2008. The subject matter of this related application is hereby incorporated by reference in its entirety.

BACKGROUND OF THE INVENTION

1. Field of the Invention

The present invention relates generally to packaging of microelectromechanical systems (MEMS) and complementary metal oxide semiconductor (CMOS) devices and, more specifically, to laser processing of glass frit for sealing applications.

2. Description of the Related Art

MEMS and CMOS devices have numerous applications in the areas such as electronics, information processing and projections displays. MEMS and CMOS devices are typically fabricated by bonding a capping layer over an underlying a wafer or substrate bearing active devices (such a wafer or substrate is referred to herein as a "workpiece"). Conventionally, bonding of the capping layer to the workpiece is accomplished utilizing bonding agents requiring a high temperature step.

Glass frit is a well-known bonding agent capable of maintaining a hermetic seal. One approach to packaging MEMS and CMOS devices includes creating an assembly comprising a workpiece, glass frit disposed on top of the workpiece, and a capping layer disposed on top of the glass frit. Subsequently, the assembly is heated to 400° C. or above to induce a glassy transition in the glass frit and to bond the workpiece and the capping layer once the assembly is cooled. One drawback to this approach, however, is that the entire assembly is heated to high temperatures. As a result, some materials may be outgassed, which may contaminate the active devices included on the workpiece. In addition, heating the entire assembly to high temperatures is undesirable for applications involving lubricants, such as for some MEMS devices.

As the foregoing illustrates, there is a need in the art for improved methods of sealing MEMS and CMOS devices.

SUMMARY OF THE INVENTION

One or more embodiments of the invention provide methods for sealing an opening in a device or a plurality of devices in a batch process using light-absorbing glass frit material. The glass frit material is applied and then irradiated with light having a wavelength absorbed by the glass frit material so that the glass frit ball undergoes a glassy transition and forms a seal.

According to one embodiment, the glass frit material is applied to an opening that is formed in a device and the opening is sealed when the glass frit material is irradiated using a laser that emits light having a specified wavelength. The maximum dimension of the opening that is sealed is less than 1 mm and the glass frit material may be applied as a spherical ball.

According to another embodiment, a plurality of devices formed on a common substrate are sealed in a batch process using the glass frit material. In this embodiment, the glass frit material is applied to portions to be sealed on each device and then irradiated using a laser that emits light having a specified wavelength.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a conceptual illustration of processing on a chip level, according to one embodiment of the present invention.

FIG. 3B is a conceptual illustration of processing on a wafer level, according to another embodiment of the present invention.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
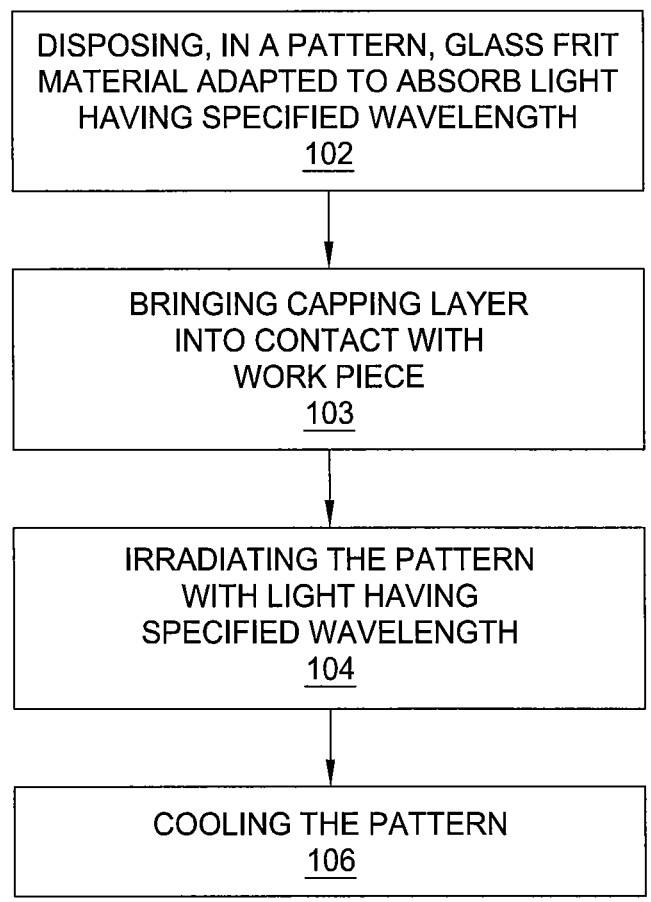
FIG. 1 sets forth a flow diagram of method steps for creating a hermetic seal on a workpiece, according to one embodiment of the present invention.

FIG. 1 sets forth a flow diagram 100 of method steps for creating a hermetic seal on a workpiece, according to one embodiment of the present invention. While the method is described with relation to a workpiece comprising MEMS or CMOS devices, the same method may be applied to any workpiece requiring a hermetic seal over at least a portion of the workpiece.

The method begins in step 102, where glass frit material is disposed in a pattern. In one embodiment, the glass frit material may be disposed over the workpiece that includes active devices, such as, for example, MEMS or CMOS devices. In another embodiment, the glass frit material may be disposed in a pattern on a capping layer that is subsequently brought into contact with the workpiece. The glass frit material is adapted to absorb light having a specified wavelength by incorporating, in the glass frit material, at least one energy absorbing enhancer. In one embodiment, the energy absorbing enhancer may include one or more metal oxides that absorb light energy of a desired wavelength, such as chromium dioxide ($CrO_2$), cupric oxide, ($CuO$), ferric oxide ($Fe_2O_3$), vanadium pentoxide ($V_2O_5$), and/or titanium dioxide ($TiO_2$), among others. The metals oxides selected as energy absorbing enhancers depend on the desired wavelength of light to be absorbed. The pattern of glass frit material disposed on the capping layer may be any technically feasible pattern that allows sealing of the active devices included on the workpiece. For example, in one embodiment, the pattern may include a closed loop, surrounding the active devices on the workpiece. In another embodiment, the pattern may be an individual bead of the glass frit material positioned to cover an opening in the workpiece.

In step 103, a capping layer is brought into contact with the workpiece, sandwiching the pattern of glass frit material therebetween. In step 104, the pattern of glass frit material is irradiated with light having a desired wavelength, where the light is incident on the glass frit material after passing through the capping layer. The light may be produced by any optical power source, such as, for example, lasers, laser diodes, or direct diodes. In one embodiment, the wavelength and the output power of the optical power source are selected based on the absorptive properties of the capping layer through which the light energy must pass before being absorbed by the energy absorbing enhancer in the glass frit material, as described below in conjunction with FIGS. 2A-C. In another embodiment, the wavelength and the output power of the optical power source are selected based on the composition of the energy absorbing enhancer in the glass frit material. The energy absorbing enhancers incorporated within the glass frit promote absorption of the light produced by the optical power source, thereby locally elevating the temperature of the glass frit material to a desired value. In this fashion, the light produced by the optical power source may quickly produce the required temperature in localized areas of the workpiece, causing a glassy transition of the glass frit material. In step 106, the pattern of glass frit material is allowed to cool, thereby hermetically sealing the workpiece.

Figure 2A:
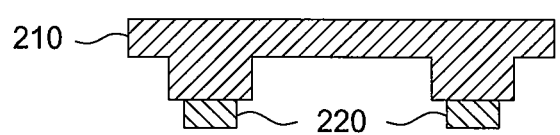
FIGS. 2A through 2C illustrate the process of sealing a workpiece with a capping layer, according to one embodiment of the present invention.
Figure 2B:
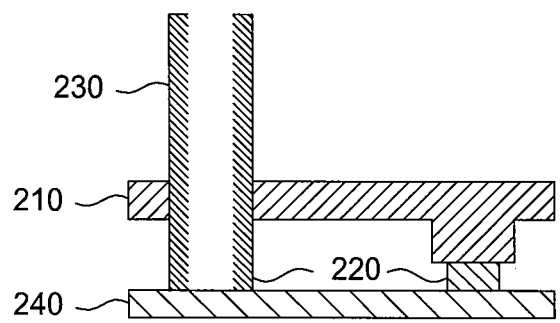
Figure 2C:
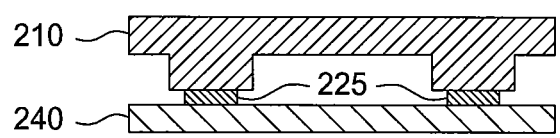

FIGS. 2A through 2C illustrate the process of sealing a workpiece with a capping layer, according to one embodiment of the present invention. FIG. 2A illustrates a glass frit material 220 disposed, in a pattern, over a capping layer 210, as described in step 102. FIG. 2B illustrates irradiating the pattern with light 230, as described in step 104, after capping layer 210 is brought in contact with a workpiece 240.

The wavelength and the output power of the optical power source as well as the composition of the glass frit material 220 may be set so that most of the light 230 may be transmitted through the capping layer 210 and absorbed by the glass frit material 230. For example, consider that the capping layer 210 comprises glass. As is well-known, glass transmits visible light, including red light, i.e., light having a wavelength around 800 nm. To accommodate a capping layer 210 comprised of glass and positioned between glass frit material 220 and an optical power source, the glass frit material 220 may be adapted to incorporate energy absorbing enhancers that absorb light having a wavelength of 800 nm. With such a configuration, irradiating the pattern through the capping layer 210 with light 230 having a wavelength of approximately 800 nm results in a substantial amount of light 230 being transmitted through the capping layer 210 and absorbed by the glass frit material 220.

Alternatively, the capping layer 210 may comprise silicon. Persons skilled in the art will recognize that, while absorption of silicon is high at 800 nm, very little light is absorbed between 1.2 um and 6.5 um, the wavelength range commonly referred to as "mid-IR range." To accommodate a capping layer 210 comprised of silicon and positioned between glass frit material 220 and an optical power source, glass frit material 220 may include energy absorbing enhancers that absorb light having a wavelength in the mid-IR range. With such a configuration, irradiating the pattern through the capping layer 210 with light 230 having a wavelength in the mid-IR range results in a substantial amount of light 230 being transmitted through capping layer 210 and absorbed by the glass frit material 220. $CO_2$ lasers known in the art may be used for such an embodiment.

By selecting the wavelength and output power of the optical power source and the composition of glass frit material 220 so that most of light 230 is transmitted through one or more intervening layers and absorbed by the glass frit material 220, irradiating the pattern with the light 230 heats the glass frit material 220, causing that material to undergo a glassy transition. FIG. 2C illustrates that, after undergoing such a glassy transition, cooling the pattern of glass frit material 220 creates a seal 225 between the capping layer 210 and the workpiece 240, as described in step 106.

In various embodiments, processing the glass frit may be performed either on a chip level or on a wafer level. FIG. 3A is a conceptual illustration of processing on a chip level, according to one embodiment of the present invention. As shown, a chip 300A includes a pattern 315A of glass frit material. The pattern 315A encompasses an area 320A which may include one or more active devices, such as MEMS or CMOS devices. A marker 330A indicates which portion of the pattern 315A is irradiated by an optical power source. In one embodiment, the optical power source is configured to scan the pattern 315A along the direction of arrows 340A, thereby inducing a glassy transition in the glass frit material and generating a permanent seal encompassing the area 320A. In other embodiments, multiple light beams may simultaneously irradiate different portions of the pattern 315A, generating a permanent seal based on at least a portion of the pattern 315A.

FIG. 3B is a conceptual illustration of processing on a wafer level, according to another embodiment of the present invention. As shown, a wafer 300B includes plurality of patterns 315B of glass frit material. Each of the patterns 315B encompasses an area 320B which may include one or more active devices, such as MEMS or CMOS devices. As shown, the light produced by an optical power source may be split into multiple beams to several patterns 315B to be processed simultaneously. Multiple beams may be generated from a single optical power source by, for example, using a beam splitter. In another embodiment, multiple optical power sources may be available to simultaneously irradiate several of the patterns 315B. Markers 330B indicate which portion of each of the patterns 315B is irradiated by an optical power source. Similar to FIG. 3A, the optical power source may be configured to scan each of the patterns 315B along the direction of arrows 340B, thereby inducing a glassy transition in the glass frit material and generating a permanent seal around each of the areas 320B.

Figure 4A:
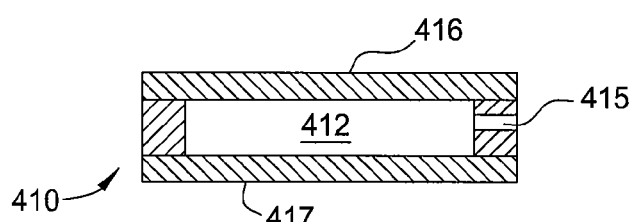
FIGS. 4A through 4D illustrate the process of sealing an opening in a workpiece, according to one embodiment of the present invention.
Figure 4B:
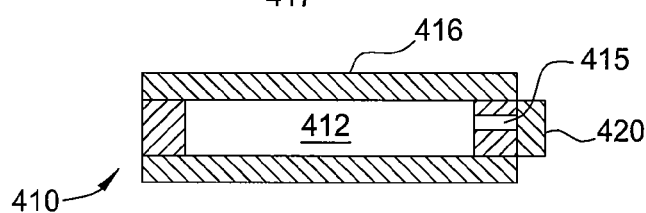
Figure 4C:
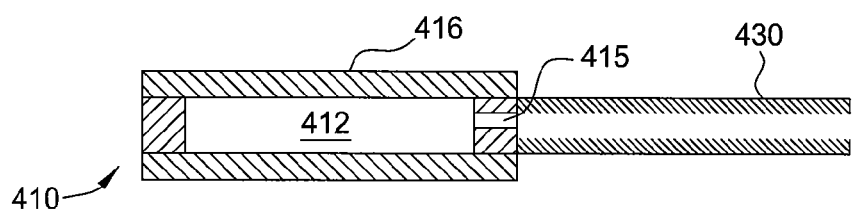
Figure 4D:
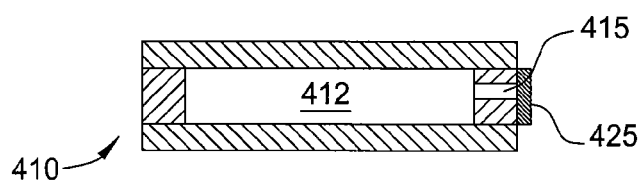

FIGS. 4A through 4D illustrate the process of sealing an opening 415 in a workpiece 410, according to one embodiment of the present invention. FIG. 4A illustrates workpiece 410 having a chamber 412 and opening 415 disposed in a side wall of workpiece 410. In various embodiments, opening 415 may be disposed in other locations in workpiece 410 such as, for example, a top wall 416 or a bottom wall 417. FIG. 4B illustrates glass frit material 420 disposed in a pattern over opening 415 of workpiece 410. FIG. 4C illustrates irradiation of glass frit material 420 with light 430. Again, by setting the wavelength and the output power of the optical power source and the composition of glass frit material 420 so that most of light 430 is absorbed by glass frit material 420, irradiating the pattern with light 430 heats glass frit material 420, which undergoes a glassy transition. FIG. 4D illustrates that, after undergoing the glassy transition, cooling glass frit material 420 creates a seal 425 over opening 415.

Figure 5A:
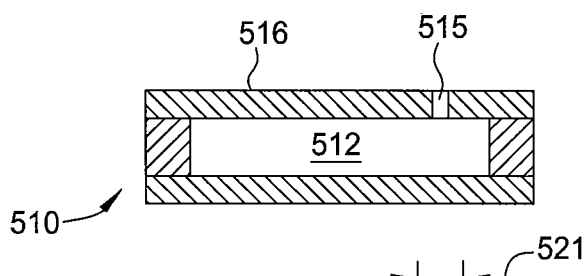
FIGS. 5A through 5D illustrate the process of sealing an opening in a workpiece, according to another embodiment of the present invention.
Figure 5B:
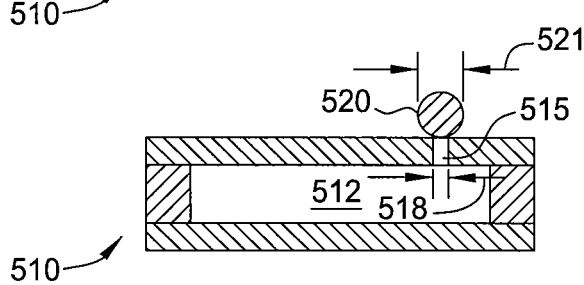
Figure 5C:
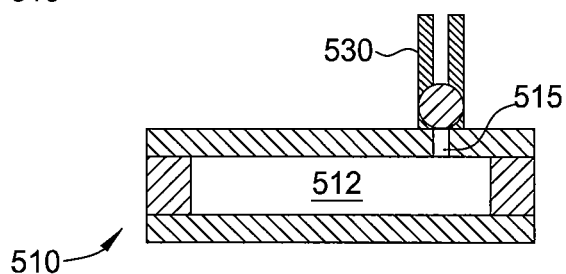
Figure 5D:
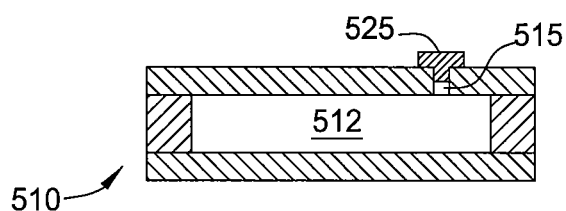

FIGS. 5A through 5D illustrate the process of sealing an opening 515 in a workpiece 510, according to one embodiment of the present invention. FIG. 5A illustrates workpiece 510 having a chamber 512 and opening 515 in a top wall 516 of workpiece 510. FIG. 5B illustrates glass frit bead 520 disposed in a pattern over opening 515 of workpiece 510. As shown, glass frit bead 520 is substantially spherical in shape, with a diameter 521 larger than the width 518 of opening 515. One advantage of employing a spherically-shaped glass frit bead 520 is that once the workpiece 510 is formed, spheres of glass frit material 520 may be placed directly over opening 515 using pick-and-place methods known in the art for placing solder balls on ball grid arrays (BGAs). Another advantage of employing a spherically-shaped glass frit bead 520 is that glass frit bead 520 may be pre-glazed prior to being disposed on workpiece 510 to burn out organic solvents and other contaminants present in the glass frit material. Pre-glazing glass frit bead 520 purifies the glass frit material 520 to reduce or eliminate subsequent outgassing of contaminants into chamber 512. FIG. 5C illustrates irradiating the pattern with light 530. Again, by configuring the wavelength and the output power of the optical power source and the composition of glass frit bead 520 so that most of light 530 is absorbed by the glass frit bead 520, irradiating the pattern with light 530 heats the glass frit material 520, causing that material to undergo a glassy transition. FIG. 5D illustrates that, after undergoing the glassy transition, cooling glass frit bead 520 creates a seal 525 over the workpiece 510. Lasers known in the art have a resolution of 600 pixels per inch (PPI), allowing the irradiation of glass frit beads 520 having a diameter of less than 100 microns, when desired.

In some applications, it is beneficial for a glass frit seal, such as seal 525 in FIG. 5D, to substantially protrude from the sealed opening after the glass frit material cools. In other applications, it is beneficial for such a glass frit seal to be substantially flush with the surrounding surfaces of the work or even to be concave with respect to such surfaces after the glass frit material cools. According to embodiments of the invention, the volume of a glass frit bead used to seal an opening may be selected to form either a protruding convex seal, a substantially flush seal, or a concave seal in an opening formed in a workpiece, as desired.

Figure 6A:
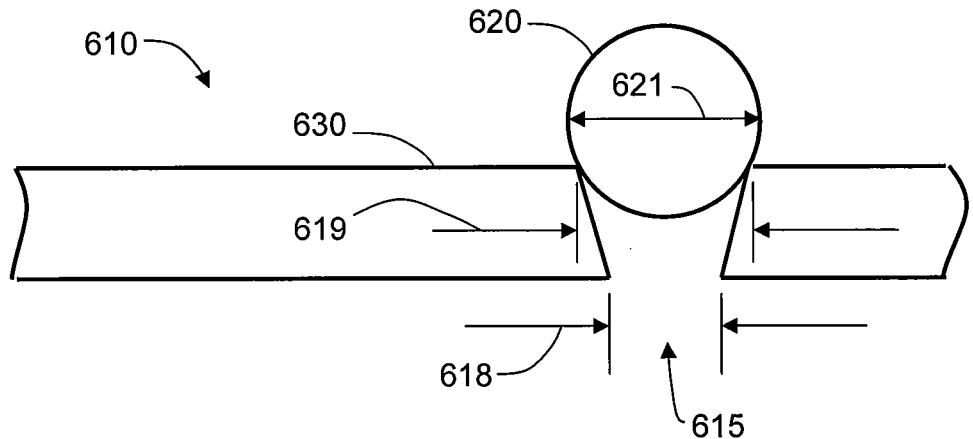
FIG. 6A is a partial schematic view of a workpiece with a glass frit bead disposed in an opening formed in a workpiece.
Figure 6B:
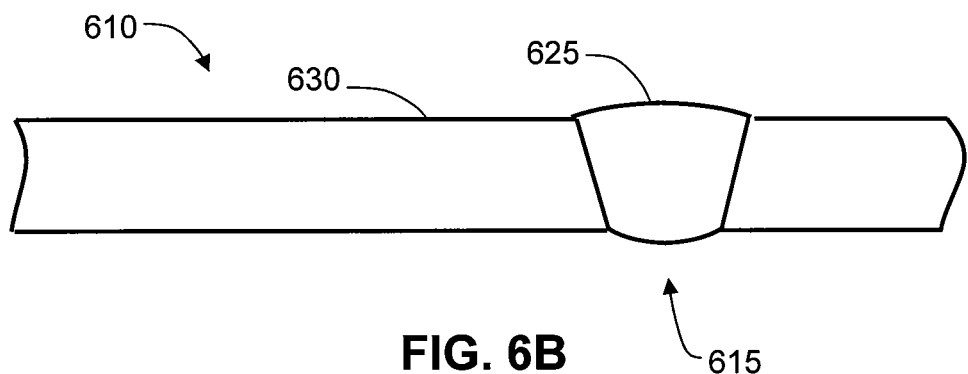
FIG. 6B illustrates a protruding seal formed in an opening in a workpiece.
Figure 6C:
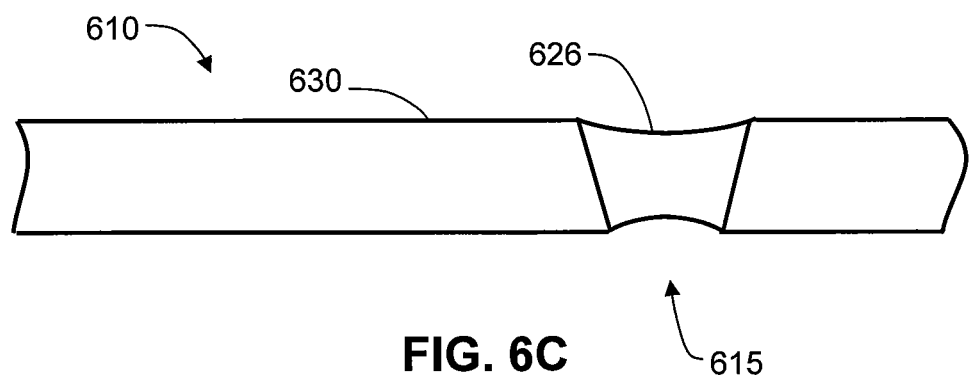
FIG. 6C illustrates a concave seal formed in an opening in a workpiece.

FIG. 6A is a partial schematic view of a workpiece 610 with a glass frit bead 620 disposed in an opening 615 formed in workpiece 610. Opening 615 is illustrated as tapered in cross-section, although other geometries for opening 615 are also contemplated by embodiments of the invention. In one embodiment, opening 615 has a maximum width 619 of about 300-500 microns and a minimum width 618 of about 100 microns. In other applications, the maximum dimension of opening 615 is 1 mm or less, where the "maximum dimension" of the opening is defined as the diameter of opening 615 when opening 615 is circular in cross-section and the "maximum dimension" of the opening is defined as the diagonal across opening 615 when opening 615 is square or rectangular in cross-section. Glass frit bead 620 has a diameter 621 that is larger than the minimum width 618 of opening 615, so that glass frit bead 620 may be placed on opening 615 as shown. The volume of glass frit bead 620 is selected to form a seal having the desired geometry after the glass frit material cools. For example, in order to form a seal that substantially protrudes from opening 615 after cooling, the diameter of glass frit bead 620 may be selected so that the total volume of glass frit material contained in glass frit bead 620 is substantially greater than the volume of opening 615. FIG. 6B illustrates a protruding seal 625 formed in opening 615 in workpiece 610. Alternatively, in order to form a seal that is concave with respect to surface 630 of workpiece 620 after cooling, the diameter of glass frit bead 620 may be selected so that the total volume of glass frit material contained in glass frit bead 620 is substantially less than the volume of opening 615. FIG. 6C illustrates a concave seal 626 formed in opening 615 in workpiece 610.

Figure 7A:
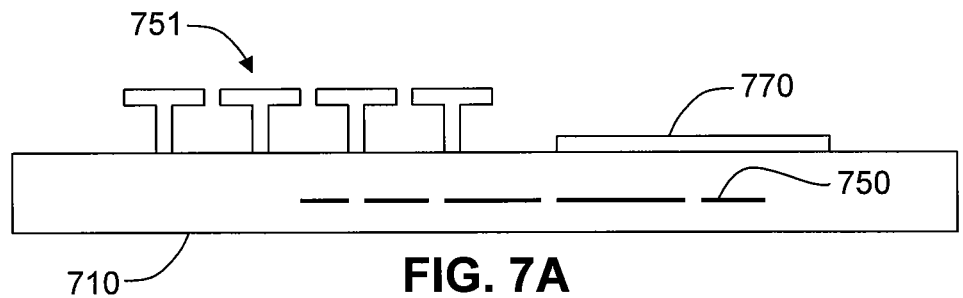
FIGS. 7A-7E illustrate the process of sealing an opening in a workpiece with CMOS circuitry contained therein and a plurality of MEMS devices formed thereon, according to an embodiment of the present invention.
Figure 7B:
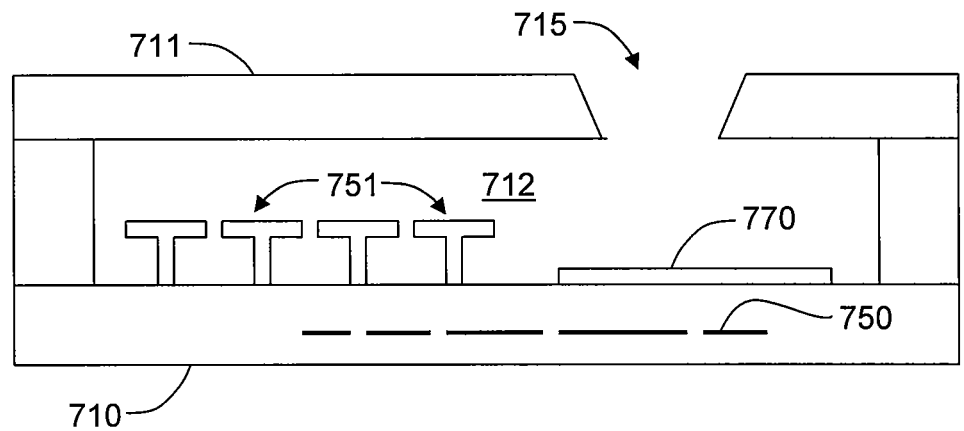
Figure 7C:
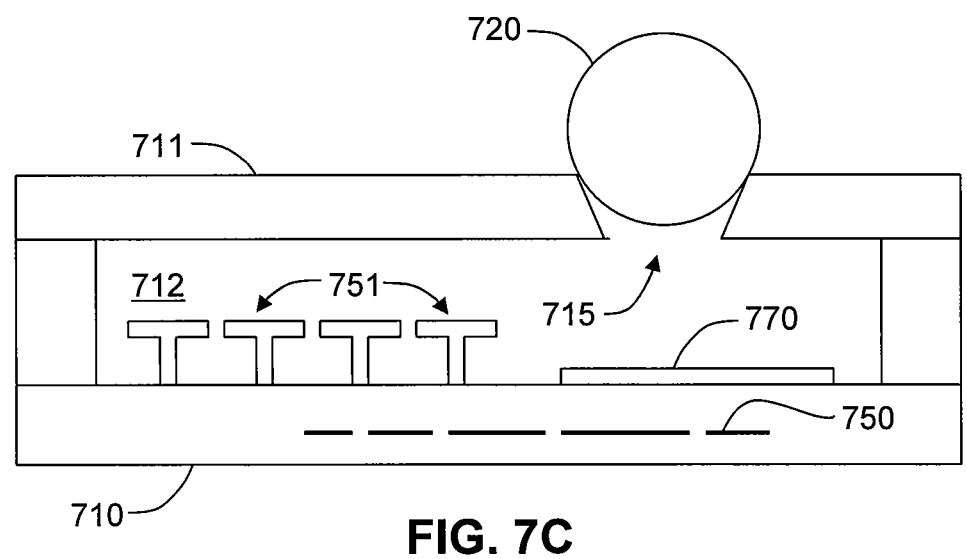
Figure 7D:
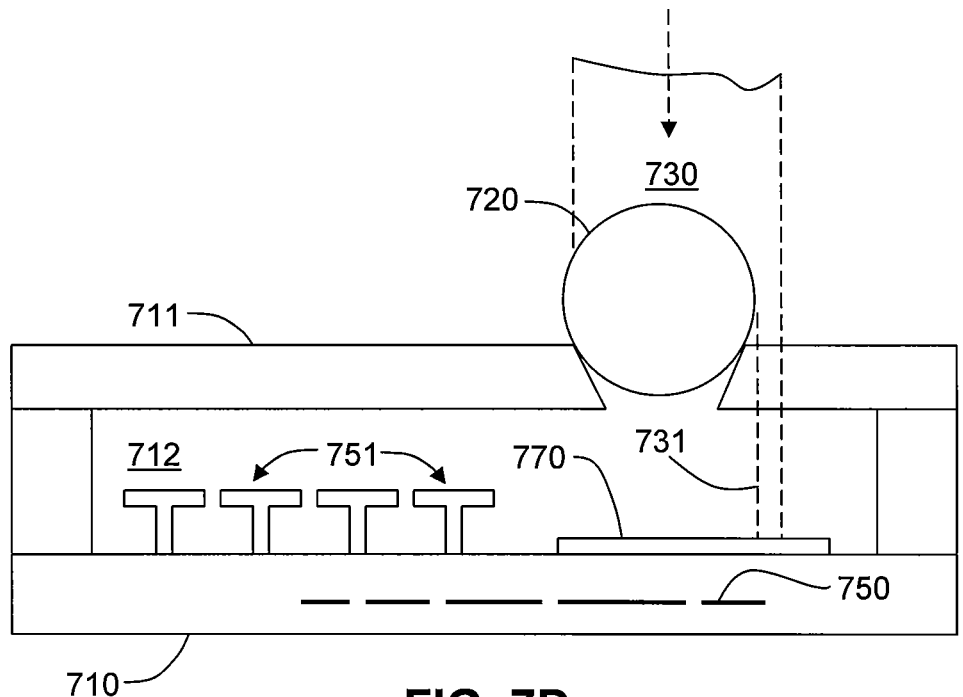
Figure 7E:
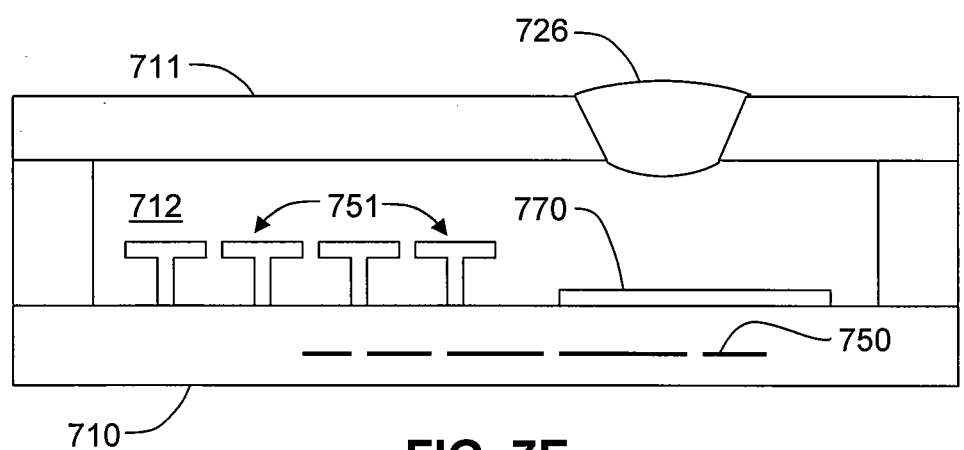

In one embodiment, a reflective surface may be formed on an internal surface of a workpiece to reduce the risk of stray or unabsorbed optical energy used to irradiate glass frit balls heating and damaging sensitive components of the workpiece. FIG. 7A illustrates a schematic side view of a workpiece 710 with CMOS circuitry 750 contained therein and a plurality of MEMS devices 751 formed thereon. A reflective surface 770 is formed on a region of the workpiece that may be affected by incident laser light that is not completely absorbed by glass frit beads in a subsequent process step. FIG. 7B illustrates a schematic side view of workpiece 710 with a capping layer 711 attached thereto to form a cavity 712. Capping layer 711 has an opening 715 formed therein. Capping layer 711 may also include an interposer layer attached thereto to form cavity 712. Opening 715 may be formed in capping layer 711 to allow insertion of a lubricant into cavity 712 for improved operation of MEMS devices 751. FIG. 7C illustrates a schematic side view of workpiece 710 with a glass frit bead 720 positioned on opening 715. FIG. 7D illustrates laser light 730 irradiating glass frit bead 720 so that glass frit bead undergoes a glassy transition. Due to slight misalignment of workpiece 710, variations in the diameter of glass frit bead 720 or the location of opening 715, and incomplete absorption of laser light 730 by glass frit bead 720, a portion 731 of laser light 730 continues past and/or through glass frit bead 720. As shown, reflective surface 770 prevents portion 731 of laser light 730 from heating and potentially damaging CMOS circuitry 750. FIG. 7E illustrates workpiece 710 with a convex seal 726 formed in opening 715 after the glass frit material of glass frit bead 720 has cooled.

Figure 8:
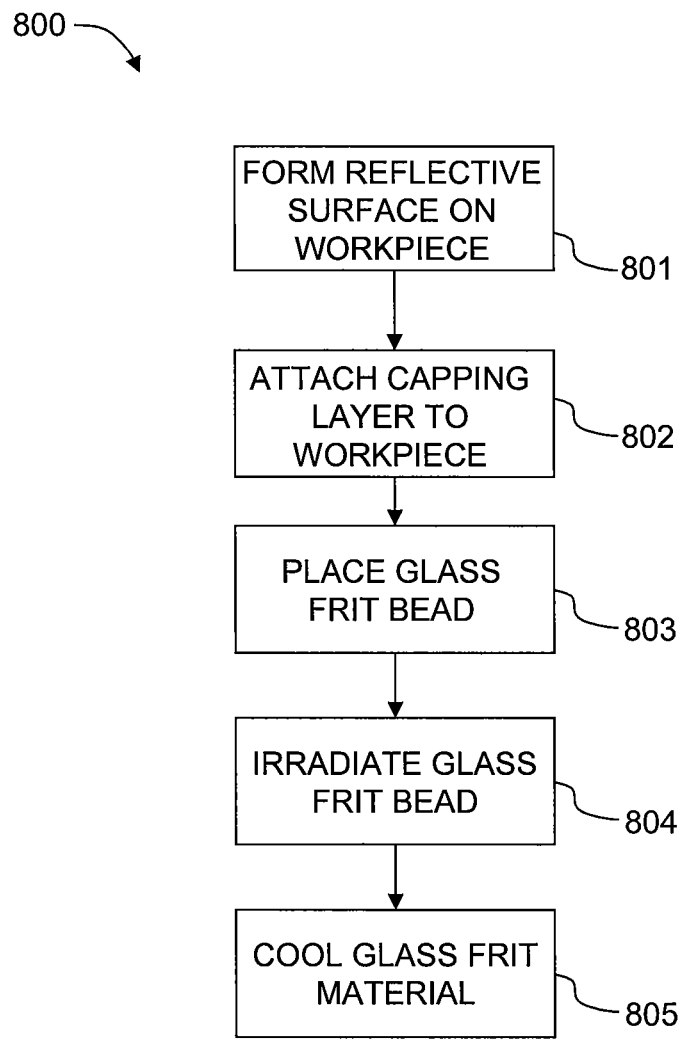
FIG. 8 is a process flow diagram summarizing the steps for sealing an opening in a workpiece, according to one embodiment of the invention.

FIG. 8 is a process flow diagram 800 summarizing the steps for sealing an opening in a workpiece, as illustrated in FIGS. 7A-E, according to one embodiment of the invention. In step 801, reflective surface 770 in FIG. 7A is formed on a region of workpiece 710. Reflective surface 770 may be formed without additional process steps for workpiece 710. In one embodiment, reflective surface 770 is formed during a final metallization step in the fabrication of CMOS circuitry 750. In another embodiment, reflective surface 770 is formed during the metallization step used to add a reflective surface on MEMS devices 751. In step 802, capping layer 711 is attached to workpiece 710. Reflective surface 770 is positioned to be in alignment with opening 715, as illustrated in FIG. 7B. In step 803, glass frit bead 720 is positioned in opening 715, as illustrated in FIG. 7C. In step 804, glass frit bead 720 is irradiated by laser light 730 and undergoes a glassy transition, as illustrated in FIG. 7D. Reflective surface 770 prevents portion 731 from heating CMOS circuitry 750. In step 805, the molten material of glass frit bead 720 cools to form convex seal 726, as illustrated in FIG. 7E.

One advantage of the disclosed method is that the temperature needed to seal the workpiece may be achieved in small localized areas of a workpiece, such as when sealing an opening in the workpiece. As a result, the need to heat the entire workpiece to high temperatures in order to induce a glassy transition in the glass frit material is eliminated. In addition, according to embodiments of the invention, the glass frit material used for sealing an opening in a workpiece can have substantially fewer contaminants than conventional glass frit material, since the glass beads may be pre-glazed and individually placed, and are not applied to the workpiece as a frit paste.

While the foregoing is directed to embodiments of the present invention, other and further embodiments of the invention may be devised without departing from the basic scope thereof, and the scope thereof is determined by the claims that follow.

We claim:

1. A method for sealing an opening in a device, comprising:
    applying a reflective film on a surface of a first wall of the device that is exposed by the opening in a second wall of the device, wherein the surface is positioned between the opening and one or more circuit elements within the device;
    applying glass frit material to the opening;
    irradiating the glass frit material using a laser that emits light having a specified wavelength; and
    cooling the glass frit material, wherein the glass frit material is light-absorbing and applied as a spherical ball such that the spherical ball covers the opening.

2. The method according to claim 1, wherein the opening is formed on a top wall of the device.

3. The method according to claim 1, wherein the spherical ball is pre-glazed to remove contaminants.

4. The method according to claim 1, wherein the opening is tapered such that the diameter of the opening decreases from top to bottom.

5. The method according to claim 1, wherein the volume of the spherical ball is less than the volume of the opening.

6. The method according to claim 1, wherein the volume of the spherical ball is greater than the volume of the opening.

7. The method according to claim 1, further comprising: focusing the laser to irradiate the glass frit material and reduce irradiation of portions of the device surrounding the glass frit material.

8. The method according to claim 1, wherein the glass frit material includes materials absorb light having a wavelength in the mid-IR range.

9. The method according to claim 1, wherein the circuit elements comprise CMOS circuitry.

10. A method for sealing a device package, comprising:
    applying a reflective film on a surface of a first wall of the device package that is exposed by an opening in a second wall of the device package, wherein the surface is positioned between the opening and one or more circuit elements within the device package;
    applying a light-absorbing glass frit material to cover the opening having a maximum dimension of less than 1 mm;
    irradiating the glass frit material using a laser that emits light having a specified wavelength; and
    cooling the glass frit material.

11. The method according to claim 10, wherein the opening is formed on a top wall of the device.

12. The method according to claim 10, wherein the opening is formed on a sidewall of the device.

13. The method according to claim 10, wherein the laser emits visible light.

14. The method according to claim 10, wherein the laser emits light having a wavelength in the mid-IR range.

15. The method according to claim 10, wherein the glass frit material includes materials that absorb light having a wavelength in the mid-IR range.

16. The method according to claim 10, wherein the circuit elements comprise CMOS circuitry.

17. A method for sealing a plurality of devices formed on a substrate, comprising:
    for each device, applying a reflective film on a surface of a first wall of said each device that is exposed by an opening in a second wall of said each device and that is positioned between the opening and one or more circuit elements within said each device;
    on said each device, disposing a light-absorbing glass frit material on a portion of said each device that is to be sealed;
    irradiating the glass frit material using a laser that emits light having a specified wavelength; and
    cooling the substrate.

18. The method according to claim 17, further comprising disposing a capping layer on the substrate, wherein the glass frit material disposed on the devices is irradiated locally to seal the capping layer.

19. The method according to claim 18, wherein the glass frit material is disposed in a pattern and the laser is scanned to follow the pattern as the laser is emitting light to irradiate the glass frit material.

20. The method according to claim 17, wherein each device has an opening through its top layer and the glass frit material is applied to cover the opening.

21. The method according to claim 20, wherein the glass frit material is applied as a spherical ball.

22. The method according to claim 21, wherein the volume of each spherical ball is less than the volume of the opening that it covers.

23. The method according to claim 21, wherein the volume of each spherical ball is greater than the volume of the opening that it covers.

24. The method according to claim 17, wherein the glass frit material includes materials that absorb light having a wavelength in the mid-IR range.

25. The method according to claim 17, wherein the circuit elements comprise CMOS circuitry.

* * * * *